United States Patent [19]
Park

[11] Patent Number: 5,892,711
[45] Date of Patent: Apr. 6, 1999

[54] SECTOR PROTECTION CIRCUIT FOR A FLASH MEMORY DEVICE

[75] Inventor: Jae Kwan Park, Seoul, Rep. of Korea

[73] Assignee: Hyundai Electronics Industries Co., Ltd, Kyungki-Do, Rep. of Korea

[21] Appl. No.: 997,250

[22] Filed: Dec. 23, 1997

[30] Foreign Application Priority Data

Dec. 24, 1996 [KR] Rep. of Korea .................. 1996-71501

[51] Int. Cl.$^6$ .................................................. G11C 16/04
[52] U.S. Cl. ............................. 365/185.04; 365/185.33; 365/195
[58] Field of Search .................. 365/185.04, 185.33, 365/185.29, 195

[56] References Cited

U.S. PATENT DOCUMENTS 5,594,686   1/1997   Hazen et al. ...................... 365/185.04

*Primary Examiner*—Son Mai
*Attorney, Agent, or Firm*—Scott C. Harris, Esq.

[57] ABSTRACT

There is disclosed a sector protecting circuit for a flash memory device. In order to prevent loss of data from a cell for sector protection, the sector protecting circuit for a flash memory device according to the present invention prevents loss of data by enabling a cell for sector protection to be erased or programmed along with a cell for normal sector.

4 Claims, 6 Drawing Sheets

Truth table for MUX output

| Protect | Unprotect | (program+erase) | output |
|---------|-----------|-----------------|--------|
| 1 | 0 | 0 | Positive High voltage (Vpp) |
| 0 | 1 | 0 | Negative High voltage (Vee) |
| 0 | 0 | 1 | Read-out voltage |

FIG. 5

| PROTECT | UNPROTECT | (PROGRAM+ERASE) | (ERASE*$\overline{\text{PROTECTOUT}}$) | output |
|---|---|---|---|---|
| 1 | 0 | 0 | 0 | Positive High voltage (Vpp) |
| 0 | 1 | 0 | 0 | Negative High voltage (Vee) |
| 0 | 0 | 1 | 0 | Read voltage |
| 0 | 0 | 0 | 1 | Negative High voltage (Vee) |

FIG. 7

| PROTECT | UNPROTECT | (PROGRAM+ERASE) | (ERASE*$\overline{\text{PROTECTOUT}}$) | output |
|---|---|---|---|---|
| 1 | 0 | 0 | 0 | Positive High voltage (Vpp) |
| 0 | 1 | 0 | 0 | Negative High voltage (Vee) |
| 0 | 0 | 1 | 0 | Read voltage |
| 0 | 0 | 0 | 1 | Negative High voltage (Vee) |

FIG. 9

| PROTECT | UNPROTECT | (PROGRAM+ERASE) | (erase*$\overline{\text{PROTECTOUT}}$) | (PROGRAM*PROTECTOUT) | output |
|---|---|---|---|---|---|
| 1 | 0 | 0 | 0 | 0 | Positive High voltage (Vpp) |
| 0 | 1 | 0 | 0 | 0 | Negative High voltage (Vee) |
| 0 | 0 | 1 | 0 | 0 | Read voltage |
| 0 | 0 | 0 | 1 | 0 | Negative High voltage (Vee) |
| 0 | 0 | 0 | 0 | 1 | Positive High voltage (Vpp) |

SECTOR PROTECTION CIRCUIT FOR A FLASH MEMORY DEVICE

BACKGROUND OF THE INVENTION

1. Field of the Invention

The present invention relates to a sector protection circuit for a flash memory device. In particular, the present invention relates to a sector protection circuit for a flash memory device which enables a cell for sector protection to be erased or programmed along with a cell for normal sector thereby to compensate for data loss against the cell for sector protection whenever a normal chip erasure operation or a programming operation is performed.

2. Description of the Prior Art

Generally, cell arrays are consisted of a number of memory blocks 80 through 110, as shown in FIG. 1. Word lines W/L[0] through W/L[N] of cell arrays 120 are selected by a word line decoder 70, to which a word line voltage generator 60 is connected. Bit lines B/L[0] through B/L[N] of the cell arrays are selected by a bit line multiplexer 50. In other words, transistors Q1 through QN within the bit line multiplexer 50 are selectively turned on in response to control signals from logic blocks 130, and thereby voltage from a bit line voltage generator 40 is supplied to the memory cells through the turned-on transistor.

A number of protection blocks 10 through 30 are connected to the logic blocks 130 via inverters so that they can perform a programming or erasure operation only for the remaining blocks after once programing any one of the number of memory blocks. For example, in order to protect the first memory block 80, the transistor Q1 is turned off. At this time, signals to control the transistors Q1 through Qn are generated by the logic blocks 130.

FIG. 2 is a detailed circuit diagram of a protection block shown in FIG. 1. A sector protection circuit is required to protect a specific block of a flash memory device against a programming operation or an erasure operation. A sector protection function is performed by programming or erasing a cell S1 for sector protection. The cell S1 for sector protection is programmed or erased in response to output signal of the multiplexer M1. As shown in FIG. 3, when a protect signal PROTECT is a logic 1, an unprotect signal UNPROTECT is a logic 0 and a first control signal (PROGRAM+ERASE) is a logic 0, a program gate of the cell S1 for sector protection is supplied with a positive high voltage. As a second control signal (PROTECT+UNPROTECT) is a logic 0, a PMOS transistor P2 is turned on while a PMOS transistor P1 and a NMOS transistor N1 are turned off. Therefore, the drain of the cell S1 for sector protection is supplied with a supply voltage Vdd, and thus the cell S1 for sector protection is programmed. When the protect signal PROTECT is a logic 0, the unprotect signal UNPROTECT is a logic 1 and the first control signal (PROGRAM+ERASE) is a logic 0, the program gate of the cell S1 for sector protection is supplied with a negative high voltage. As the second control signal (PROTECT+UNPROTECT) is a logic 0, the PMOS transistor P2 is turned on while the PMOS transistor P1 and the NMOS transistor N1 are turned off. Therefore, the drain of the cell S1 for sector protection is supplied with a supply voltage Vdd, and thus data stored at the cell S1 for sector protection is erased. In case that the flash memory device is programmed or erased, the protect signal PROTECT, the unprotect signal UNPROTECT, and the second control signal (PROTECT+UNPROTECT) is a logic 0 while the first control signal (PROGRAM+ERASE) is a logic 1, the PMOS transistor P2 is turned off while the PMOS transistor P1 and the NMOS transistor N1 are turned on. Therefore, the program gate of the cell S1 for sector protection is supplied with a read-out voltage. As a result, data stored at the cell S1 for sector protection are output to an output terminal PROT-OUT via inverters I1 and I2. This data protects a specific sector. In this conventional protection circuit, there is a problem that the protect cell could not protect the sector for which protection is required regardless of lapse of time in case that the initially programmed data are not kept in time. There is also another problem that a specified sector could not be protected when data stored at the cell for sector protection are lost by means of stress.

SUMMARY OF THE INVENTION

It is an object of the present invention to solve the problems involved in the prior art, and to provide a sector protection circuit for a flash memory device which enables a cell for sector protection to be erased or programmed along with a cell for normal sector thereby to compensate for data loss against the cell for sector protection whenever a normal chip erasure operation or a programming operation is performed.

To achieve the above object, the sector protection circuit for a flash memory device according to the present invention is characterized in that it comprises a cell for sector protection consisted of a source, a drain, and a program gate, having programming and erasure functions, said cell being supplied with a constant voltage; a multiplexer for outputting a read-out voltage, a positive high voltage, and a negative high voltage to supply for the program gate of said cell for sector protection, in response to a first control signal logically ORing a protect signal, an unprotect signal, a program signal, and an erasure signal; a third control signal logically ANDing said erasure signal and inverted sector protection signal; and a seventh control signal logically ANDing said program signal and said sector protection signal; a first means for supplying a supply voltage for said drain of said cell for sector protection, in response to a eighth control signal which logically ORs a second control signal logically ORing said protect signal and said unprotect signal; and a signal which logically ANDs a signal logically ANDing said inverted sector protection signal and said erasure execution signal, and a signal logically ANDing said sector protection signal and said program execution signal; a first transistor for logically ORing said program signal, said erasure signal, said program preparation signal, and said erasure preparation signal and then transferring a supply voltage to a first node in response to a tenth inverted control signal; a second transistor for transferring a voltage of said first node to said drain of said cell for sector protection in response to a ninth control signal logically ORing said program signal, said erasure signal, said program preparation signal, and said erasure preparation signal; and a latch circuit for generating a sector protection signal in response to said voltage of said first node.

BRIEF DESCRIPTION OF THE DRAWINGS

Other objects and advantages of the present invention will be understood by reading the detailed explanation of the embodiment with reference to the accompanying drawings in which:

FIG. 5 is a true table for explaining FIG. 4;

FIG. 7 is a true table for explaining FIG. 6;

FIG. 9 is a true table for explaining FIG. 8.

DETAILED DESCRIPTION OF THE DRAWINGS

Below, the preferred embodiments of the present invention will be explained by reference to the accompanying drawings.

Figure 1:
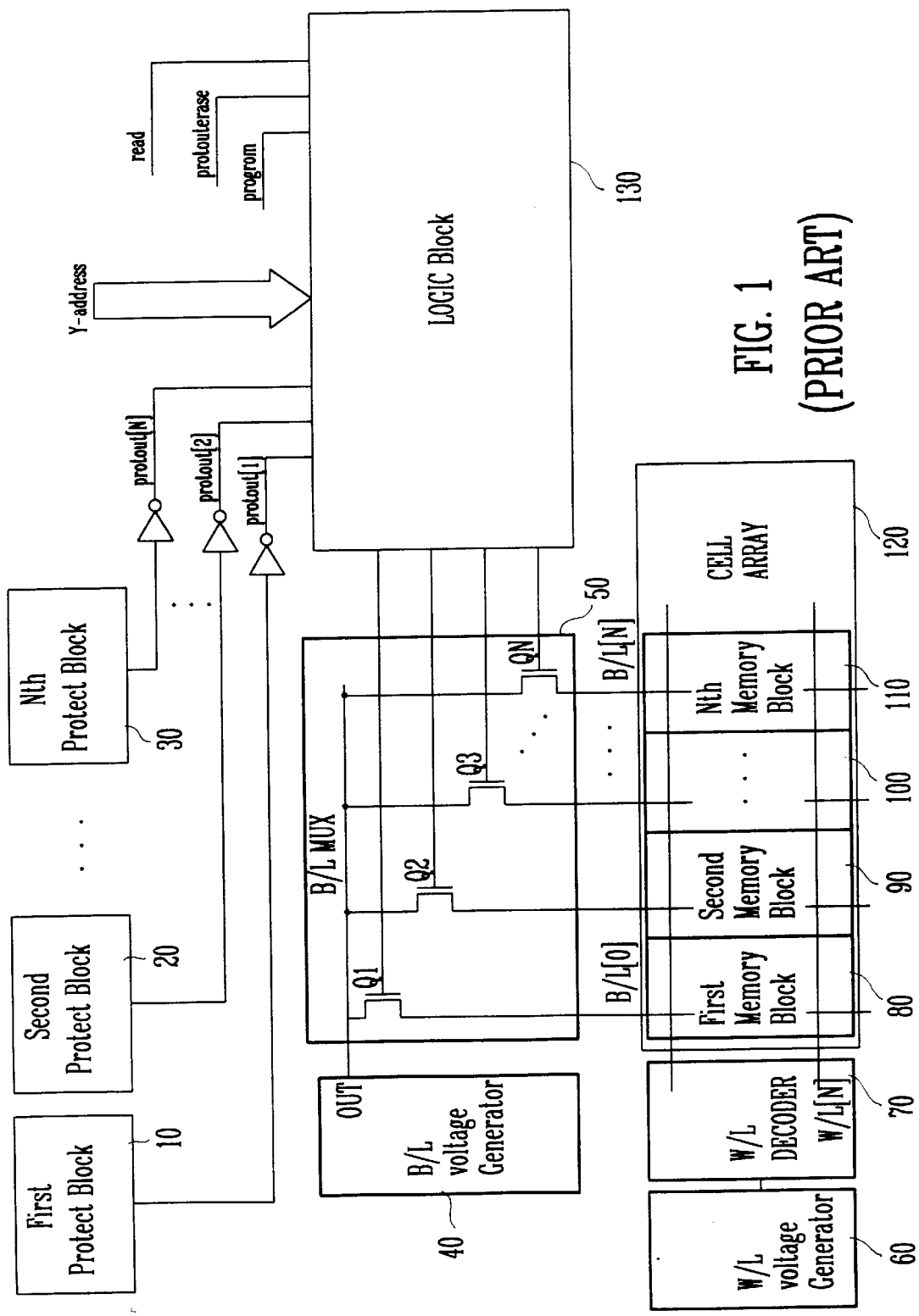
FIG. 1 is a block diagram for explaining a sector protection function of a flash memory device.
Figures 2, 3:
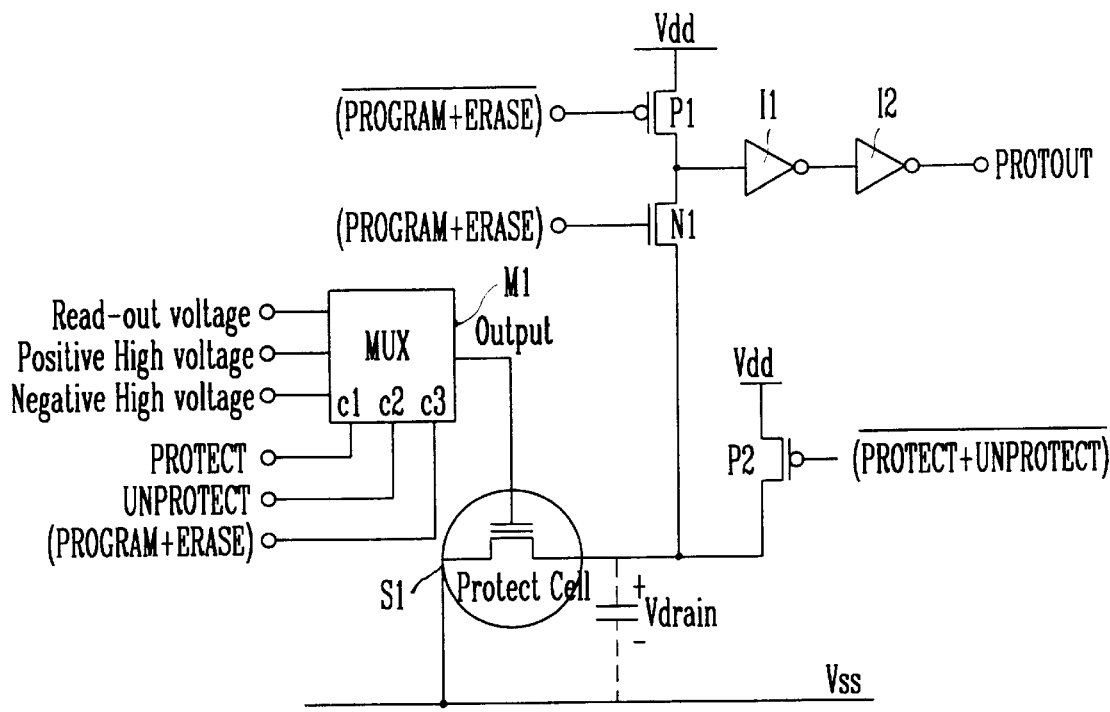
FIG. 2 is a detailed circuit diagram of a protection block shown in FIG. 1.
FIG. 3 is a true table for explaining FIG. 2.
Figure 4:
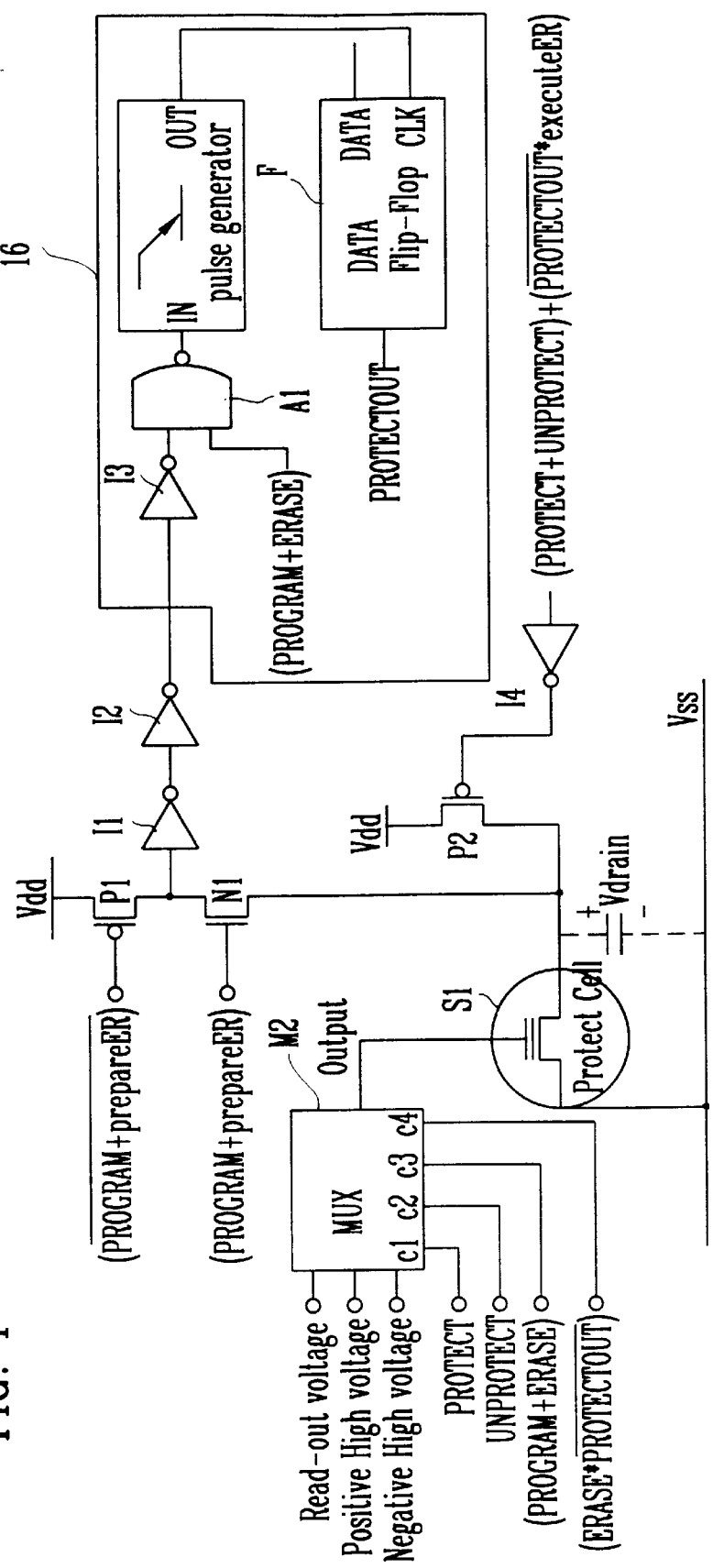
FIG. 4 is a sector protection circuit according to a first embodiment of the present invention.

Referring now to FIG. 4, there is shown a sector protection circuit according to a first embodiment of the present invention.

As shown in FIG. 4, when the protect signal PROTECT is a logic 1, the unprotect signal UNPROTECT is a logic 0, the first control signal (PROGRAM+ERASE) is a logic 0, and a third control signal (ERASE* PROTECTOUT) is a logic 0, then the program gate of the cell S1 for sector protection is supplied with a positive high voltage. As a fourth control signal [(PROTECT+UNPROTECT)+(PROTECTOUT*executeER)] is a logic 1, the output of an inverter I4 becomes a logic 0. As a fifth control signal (PROGRAM+prepareER) is a logic 0 while a sixth control signal (PROGRAM+prepareER) is a logic 1, the PMOS transistor P2 is turned on while the PMOS transistor P1 and the NMOS transistor N1 are turned off. Therefore, the drain of the cell S1 for sector protection is supplied with a supply voltage Vdd, and thus the cell S1 for sector protection is programmed.

Next, when the protect signal PROTECT is a logic 0, the unprotect signal UNPROTECT is a logic 1, the first control signal (PROGRAM+ERASE) is a logic 0, and the third control signal (ERASE*PROTECTOUT) is a logic 0, then the program gate of the cell S1 for sector protection is supplied with a negative high voltage. As the fourth control signal [(PROTECT+UNPROTECT)+(PROTECTOUT*executeER)] is a logic 1, the output of the inverter I4 becomes a logic 0. As the fifth control signal (PROGRAM+prepareER) is a logic 0 while the sixth control signal (PROGRAM+prepareER) is a logic 1, the PMOS transistor P2 is turned on while the PMOS transistor P1 and the NMOS transistor N1 are turned off. Therefore, the drain of the cell S1 for sector protection is supplied with a supply voltage Vdd, and thus data stored at the cell S1 for sector protection is erased.

Erasure operation may be internally classified into a preparation step and an execution step, in which the above mentioned signal prepareER keeps the supply voltage Vdd at the erasure preparation step and the executeER signal keeps the supply voltage Vdd at the erasure execution step.

In case of erasing the flash memory device, during the erasure preparation step, as the protect signal, the unprotect signal, and the third control signal (ERASE* PROTECTOUT) are a logic 0 while the first control signal (PROGRAM+ERASE) is a logic 1, then the PMOS transistor P2 is turned off while the PMOS transistor P1 and the NMOS transistor N1 are turned on. The program gate of the cell S1 for sector protection is supplied with a read-out voltage. Therefore, data stored at the cell S1 for sector protection are output to the inverter I3 of the output circuit 16 and the input terminal DATA of a flipflop F via the inverters I1 and I2. The output signal of the inverter I3 is inputted into a pulse generator 5 via an AND gate A1 in response to the first control signal (PROGRAM+ERASE). The pulse generator 5 outputs a high pulse when the input signal thereof transits from a high level to a low level. This pulse is inputted into a clock terminal of the flipflop F. In response to the signal inputted into the clock terminal, a sector protection signal PROTECTOUT is generated thereby to protect a specific sector. Thereafter, in an actual erasure step, when the third control signal (ERASE* PROTECTOUT) is a logic 1, the fifth control signal (PROGRAM+prepareER) is a logic 0, the sixth control signal (PROGRAM+prepareER) is a logic 1, and the fourth control signal [(PROTECT+UNPROTECT)+(PROTECTOUT*executeER)] is a logic 1, then the program gate of the cell S1 for sector protection is supplied with a high voltage, the drain thereof is supplied with a voltage of Vdd via the PMOS transistor P2, and thus data stored at the cell S1 for sector protection are erased.

Figure 6:
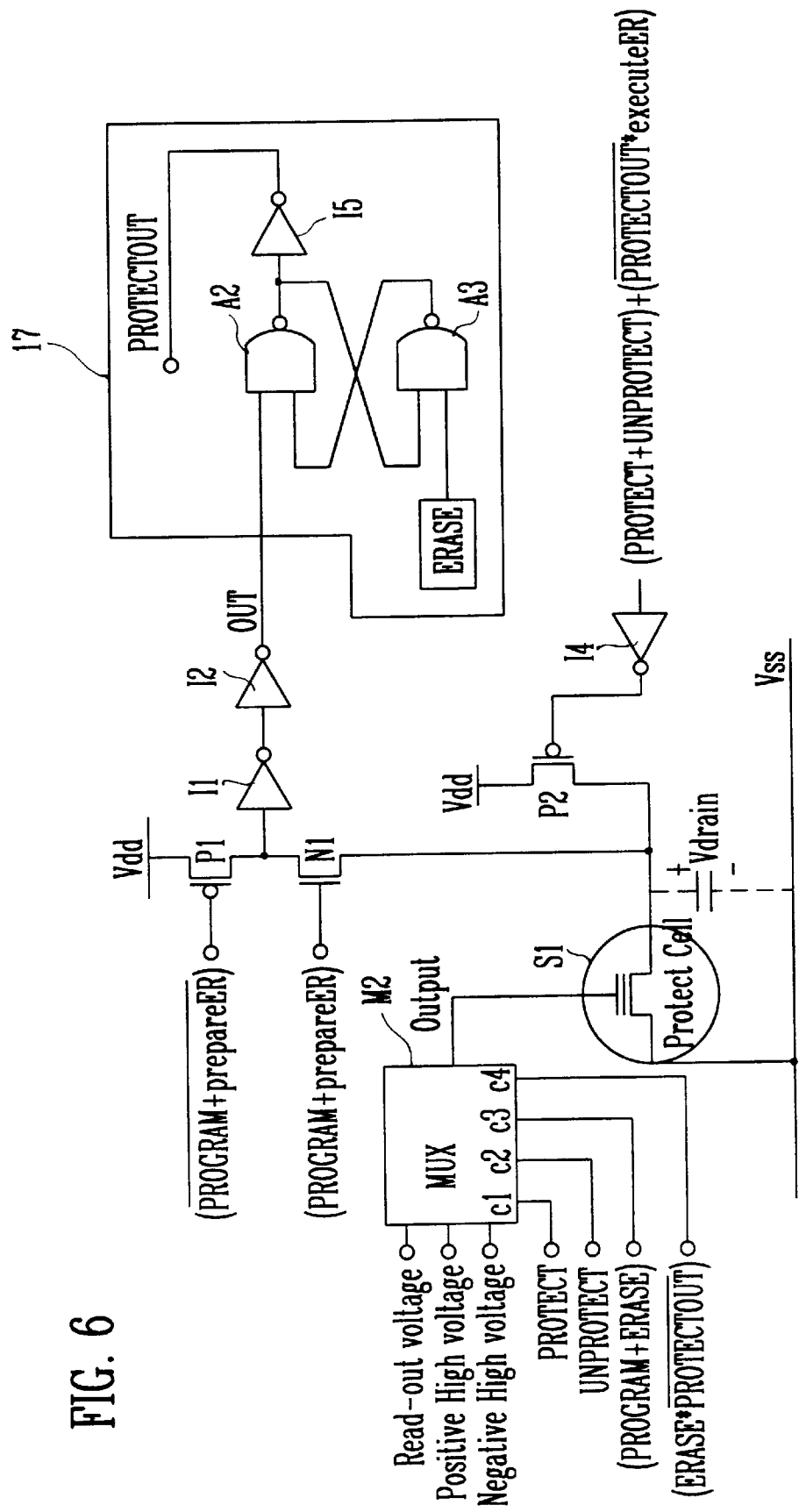
FIG. 6 is a sector protection circuit according to a second embodiment of the present invention.

Referring now to FIG. 6, there is shown a sector protection circuit according to a second embodiment of the present invention.

As the construction of FIG. 6 is same with that of FIG. 4 except for an output circuit 17, an explanation will given to only the output circuit 17. The outputs of the multiplexer M2 in FIG. 6 are given as a true table of FIG. 7, which is same with that of FIG. 5. The signal via the inverter I2 is latched by a latch circuit consisted of NAND gates A2 and A3 in response to the erase signal ERASE, and then is output via the inverter I5 thereby to generate the sector protection signal PROTECTOUT.

Figure 8:
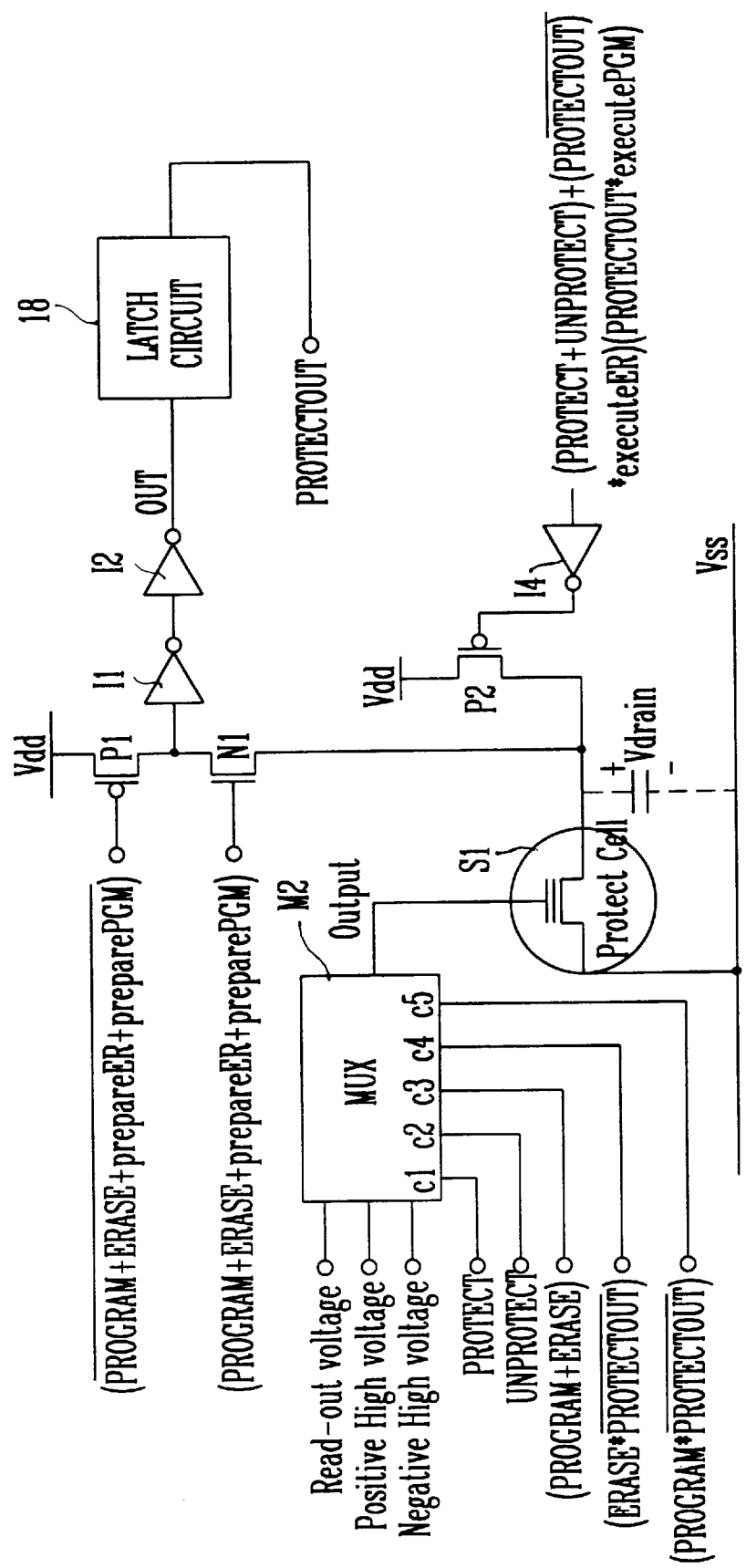
FIG. 8 is a sector protection circuit according to a third embodiment of the present invention.

Turning to FIG. 8, there is shown a sector protection circuit according to a third embodiment of the present invention. An explanation will be given below by reference to FIG. 9.

As shown in FIG. 8, when the protect signal PROTECT is a logic 1, the unprotect signal UNPROTECT is a logic 0, the first control signal (PROGRAM+ERASE) is a logic 0, the third control signal (ERASE*PROTECTOUT) is a logic 1, and a seventh control signal (PROGRAM*PROTECTOUT) is a logic 0, then the program gate of the cell S1 for sector protection is supplied with a positive high voltage. As the eighth control signal [(PROTECT+UNPROTECT)+ (PROTECTOUT*executeER)(PROTECTOUT*executePGM)] is a logic 1, the output of the inverter I4 becomes a logic 0. As a ninth control signal (PROGRAM+ERASE+prepareER+preparePGM) is a logic 0 while the tenth control signal ( PROGRAM+ERASE+preparcER+preparePGM) is a logic 1, the PMOS transistor P2 is turned on while the PMOS transistor P1 and the NMOS transistor N1 are turned off. Therefore, the drain of the cell S1 for sector protection is supplied with a supply voltage Vdd, and thus the cell S1 for sector protection is programmed.

Next, when the protect signal PROTECT is a logic 0, the unprotect signal UNPROTECT is a logic 1, the first control signal (PROGRAM+ERASE) is a logic 0, the third control signal (ERASE*PROTECTOUT) is a logic 0 and the seventh control signal (PROGRAM*PROTECTOUT) is a logic 0, the program gate of the cell S1 for sector protection is supplied with a negative high voltage. As the eighth control signal [(PROTECT+UNPROTECT)+(PROTECTOUT* executeER)(PROTECTOUT*executePGM)] is a logic 1, the output of the inverter I4 becomes a logic 0. As the ninth control signal (PROGRAM+ERASE+prepareER+ preparePGM) while the tenth control signal (PROGRAM+ERASE+prepareER+preparePGM) is a logic 1, the PMOS transistor P2 is turned on while the PMOS transistor P1 and the NMOS transistor N1 are turned off. Therefore, the drain of the cell S1 for sector protection is supplied with a supply voltage Vdd, and thus data stored at the cell S1 for sector protection are erased.

An erasure operation of the flash memory device may be internally classified into a preparation step and an execution step, in which the above mentioned preparcER signal keeps the supply voltage Vdd at the erasure preparation step and the executeER signal keeps the supply voltage Vdd at the erasure execution step.

In case of erasing the flash memory device, during the erasure preparation step, as the protect signal, the unprotect signal, the third control signal (ERASE*$\overline{\text{PROTECTOUT}}$) and the seventh control signal ($\overline{\text{PROGRAM}}$*PROTECTOUT) are a logic 0 while the first control signal (PROGRAM+ERASE) is a logic 1, then the PMOS transistor P2 is turned off while the PMOS transistor P1 and the NMOS transistor N1 are turned on. Thus, the program gate of the cell S1 for sector protection is supplied with a read-out voltage. Therefore, data stored at the cell S1 for sector protection are inputted to a latch circuit 18 via the inverters I1 and I2. As a result, a sector protection signal PROTECTOUT is generated to protect a specific sector. Thereafter, in an actual erasure step, when the third control signal (ERASE*$\overline{\text{PROTECTOUT}}$) is a logic 1, the ninth control signal (PROGRAM+ERASE+prepareER+ preparePGM) is a logic 0, the tenth control signal (PROGRAM+ERASE+prepareER+preparePGM) is a logic 1, and the eighth control signal [(PROTECT+ UNPROTECT)+($\overline{\text{PROTECTOUT}}$*executeER) (PROTECTOUT*executePGM)] is a logic 1, then the program gate of the cell S1 for sector protection is supplied with a negative high voltage, the drain thereof is supplied with a voltage of Vdd via the PMOS transistor P2, and thus data stored at the cell S1 for sector protection are erased.

Next, in case of programming the flash memory device, during the programming preparation step, as the protect signal, the unprotect signal, the third control signal (ERASE*$\overline{\text{PROTECTOUT}}$) and the seventh control signal ($\overline{\text{PROGRAM}}$*PROTECTOUT) are a logic 0 while the first control signal (PROGRAM+ERASE) is a logic 1, then the PMOS transistor P2 is turned off while the PMOS transistor P1 and the NMOS transistor N1 are turned on. Thus, the program gate of the cell S1 for sector protection is supplied with a read-out voltage. Therefore, data stored at the cell S1 for sector protection are inputted to the latch circuit 18 via the inverters I1 and I2. As a result, a sector protection signal PROTECTOUT is generated to protect a specific sector. Thereafter, in an actual programming step, when the seventh control signal (PROGRAM*$\overline{\text{PROTECTOUT}}$) is a logic 1, the ninth control signal (PROGRAM+ERASE+prepareER+ preparePGM) is a logic 0, the tenth control signal (PROGRAM+ERASE+prepareER+preparePGM) is a logic 1, and the eighth control signal [(PROTECT+ UNPROTECT)+ ($\overline{\text{PROTECTOUT}}$*executeER) (PROTECTOUT*executePGM)] is a logic 1, then the program gate of the cell S1 for sector protection is supplied with a positive high voltage, the drain thereof is supplied with a Vdd via the PMOS transistor P2, and thus the cell S1 for sector protection are programmed.

As described above, according to the present invention, it enables a cell for sector protection to be erased or pro grammed along with a cell for normal sector thereby to compensate for data loss against the cell for sector protection whenever a normal chip erasure operation or a programming operation is performed.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A sector protection circuit for a flash memory device, comprising:

a cell for sector protection consisted of a source, a drain, and a program gate, having programming and erasure functions;

a multiplexer for outputting a read-out voltage, a positive high voltage, and a negative high voltage to supply for the program gate of said cell for sector protection, in response to a first control signal logically ORing a protect signal, an unprotect signal, a program signal and an erasure signal and a third control signal logically ANDing an erasure signal and inverted sector protection signal;

a first means for supplying a supply voltage for the drain of said cell for sector protection, in response to a fourth control signal which logically ORs a second control signal logically ORing said protect signal and said unprotect signal, and a signal logically ANDing an inverted sector protection signal and an erasure execution signal;

a first transistor for logically ORing said program signal and said erasure preparation signal and then transferring a supply voltage to a first node in response to a sixth inverted control signal;

a second transistor for transferring a voltage of said first node to said drain of said cell for sector protection in response to a fifth control signal logically ORing said program signal and said erasure preparation signal; and an output circuit for outputting and latching a sector protection signal in response to said voltage of said first node and said first control signal.

2. The sector protection circuit for a flash memory device as claimed in claim 1, wherein said output circuit further comprises a NAND gate for combining voltage of said first node and said first control signal, a pulse generator for generating a pulse in response to an output signal of said NAND gate, and a flipflop for generating a sector protection signal in response to said output of said pulse generator and said voltage of said first node.

3. The sector protection circuit for a flash memory device as claimed in claim 1, wherein said output circuit is consisted of a latch circuit.

4. A sector protection circuit for a flash memory device, comprising:

a cell for sector protection consisted of a source, a drain, and a program gate, having programming and erasure functions, said cell being supplied with a constant voltage;

a multiplexer for outputting a read-out voltage, a positive high voltage, and a negative high voltage to supply for the program gate of said cell for sector protection, in response to a first control signal logically ORing a protect signal, an unprotect signal, a program signal, and an erasure signal, a third control signal logically ANDing said erasure signal and inverted sector protection signal; and a seventh control signal logically ANDing said program signal and said sector protection signal;

a first means for supplying a supply voltage for said drain of said cell for sector protection, in response to a eighth control signal which logically ORs a second control signal logically ORing said protect signal and said unprotect signal; and a signal which logically ANDs a signal logically ANDing said inverted sector protection signal and said erasure execution signal, and a signal logically ANDing said sector protection signal and said program execution signal;

a first transistor for logically ORing said program signal, said erasure signal, said program preparation signal, and said erasure preparation signal and then transferring a supply voltage to a first node in response to a tenth inverted control signal;

a second transistor for transferring a voltage of said first node to said drain of said cell for sector protection in response to a ninth control signal logically ORing said program signal, said erasure signal, said program preparation signal, and said erasure preparation signal; and a latch circuit for generating a sector protection signal in response to said voltage of said first node.

* * * * *